United States Patent
Kang et al.

(10) Patent No.: US 9,841,676 B2
(45) Date of Patent: Dec. 12, 2017

(54) METHOD OF MANUFACTURING DISPLAY DEVICE USING BOTTOM SURFACE EXPOSURE

(71) Applicant: SAMSUNG DISPLAY CO., LTD., Yongin-si, Gyeonggi-Do (KR)

(72) Inventors: Hoon Kang, Suwon-si (KR); Bum Soo Kam, Yongin-si (KR); Se Yoon Oh, Yongin-si (KR); Chong Sup Chang, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/139,037

(22) Filed: Apr. 26, 2016

(65) Prior Publication Data
US 2017/0082922 A1    Mar. 23, 2017

(30) Foreign Application Priority Data
Sep. 21, 2015 (KR) ........................ 10-2015-0133055

(51) Int. Cl.
*B44C 1/22* (2006.01)
*C03C 15/00* (2006.01)
(Continued)

(52) U.S. Cl.
CPC .............. *G03F 7/0007* (2013.01); *C23F 1/02* (2013.01); *G03F 7/2002* (2013.01); *G03F 7/32* (2013.01);
(Continued)

(58) Field of Classification Search
None
See application file for complete search history.

(56) References Cited

U.S. PATENT DOCUMENTS 4,514,253 A * 4/1985 Minezaki ............... H01L 29/78
                                              205/124
5,622,814 A * 4/1997 Miyata .................. G02F 1/1368
                                              257/E21.414
(Continued)

FOREIGN PATENT DOCUMENTS

KR    1020080022829    3/2008
KR    1020090108268    10/2009
KR    1020100122336    11/2010

*Primary Examiner* — Stephanie Duclair
(74) *Attorney, Agent, or Firm* — F. Chau & Associates, LLC

(57) ABSTRACT

A method for manufacturing a display device includes forming a plurality of light blocking patterns on a first surface of a transparent substrate, wherein a first light blocking pattern of the plurality of light blocking patterns has a different line width than a second light blocking pattern of the plurality of light blocking patterns. An insulating layer is formed on the first surface of the transparent substrate and the light blocking patterns. A conductive layer is formed on the insulating layer. A photo-resist layer is formed on the conductive layer. The photo-resist layer is exposed with ultraviolet rays through a second surface of the transparent substrate, wherein the first and second surfaces of the transparent substrate are opposite to each other. The photo-resist layer is developed. The conductive layer is etched using the photo-resist layer as a mask. The photo-resist layer is removed.

7 Claims, 16 Drawing Sheets

(51) Int. Cl.

| | |
|---|---|
| *C03C 25/68* | (2006.01) |
| *C23F 1/00* | (2006.01) |
| *H01L 21/302* | (2006.01) |
| *H01L 21/461* | (2006.01) |
| *G03F 7/00* | (2006.01) |
| *G03F 7/20* | (2006.01) |
| *G03F 7/32* | (2006.01) |
| *H01L 31/18* | (2006.01) |
| *H01L 29/41* | (2006.01) |
| *H01L 51/44* | (2006.01) |
| *C23F 1/02* | (2006.01) |
| *H01L 21/3213* | (2006.01) |

(52) U.S. Cl.
CPC ...... *H01L 21/32134* (2013.01); *H01L 29/413* (2013.01); *H01L 31/1884* (2013.01); *H01L 31/1888* (2013.01); *H01L 51/442* (2013.01)

(56) References Cited

U.S. PATENT DOCUMENTS

| | | | |
|---|---|---|---|
| 5,847,793 A * | 12/1998 | Itoh | G02F 1/133512 349/110 |
| 6,436,740 B1 | 8/2002 | Jen et al. | |
| 7,947,525 B2 | 5/2011 | Shih | |
| 8,283,860 B2 | 10/2012 | Oh | |
| 2008/0316449 A1 * | 12/2008 | Adachi | G03B 27/00 355/53 |
| 2011/0003428 A1 * | 1/2011 | Sasaki | H01L 29/7869 438/104 |
| 2013/0128193 A1 * | 5/2013 | Yang | G02F 1/133502 349/106 |
| 2014/0078452 A1 * | 3/2014 | Lu | G02B 5/201 349/106 |

* cited by examiner

US 9,841,676 B2

METHOD OF MANUFACTURING DISPLAY DEVICE USING BOTTOM SURFACE EXPOSURE

CROSS REFERENCE TO RELATED APPLICATION(S)

This application claims priority under 35 U.S.C. §119 to Korean Patent Application No. 10-2015-0133055, filed in the Korean Intellectual Property Office on Sep. 21, 2015, the disclosure of which is incorporated by reference herein in its entirety.

TECHNICAL FIELD

Exemplary embodiments of the present invention relate to a display device manufacturing method, and more particularly, to a display device manufacturing method using a bottom surface exposure process.

DISCUSSION OF THE RELATED ART

A display device manufacturing method using a photo patterning method may be used to form a metal or transparent electrode pattern on a substrate through exposure and development of a photo-resist layer. The photo-resist layer may be disposed on the substrate and may be exposed to ultraviolet rays using an opaque pattern disposed on the substrate as a mask. In this case, it is difficult to form a metal or transparent electrode pattern that is different from the mask. Thus, an application range of the bottom surface exposure is limited to the case of forming a metal or transparent electrode pattern that corresponds to the mask.

SUMMARY

According to an exemplary embodiment of the present invention, a method for manufacturing a display device includes forming a plurality of light blocking patterns on a first surface of a transparent substrate, wherein a first light blocking pattern of the plurality of light blocking patterns has a different line width than a second light blocking pattern of the plurality of light blocking patterns. An insulating layer is formed on the first surface of the transparent substrate and the light blocking patterns. A conductive layer is formed on the insulating layer. A photo-resist layer is formed on the conductive layer. The photo-resist layer is exposed with ultraviolet rays through a second surface of the transparent substrate, wherein the first and second surfaces of the transparent substrate are opposite to each other. The photo-resist layer is developed. The conductive layer is etched using the photo-resist layer as a mask. The photo-resist layer is removed.

In an exemplary embodiment of the present invention, portions of the photo-resist layer that correspond to the plurality of light blocking patterns remain on the transparent substrate after developing the photo-resist layer.

In an exemplary embodiment of the present invention, the plurality of light blocking patterns are formed by depositing material on the first surface of the transparent substrate, wherein the material that is deposited on the first surface of the transparent substrate to form the plurality of light blocking patterns passes through a pattern mask.

In an exemplary embodiment of the present invention, a light blocking pattern of the plurality of light blocking patterns includes a metal.

In an exemplary embodiment of the present invention, the conductive layer includes a metal or a transparent electrode.

In an exemplary embodiment of the present invention, the etching includes wet-etching.

In an exemplary embodiment of the present invention, the etching includes etching the conductive layer such that a width of a conductive layer pattern that overlaps a corresponding photo-resist pattern is smaller than a width of the corresponding photo-resist pattern.

In an exemplary embodiment of the present invention, after the etching is performed, conductive layer patterns having width equal to or less than a threshold amount are completely etched and conductive layer patterns having width greater than a threshold amount remain on the transparent substrate.

In an exemplary embodiment of the present invention, an ultraviolet lamp is used to expose the photo-resist layer with ultraviolet rays.

According to an exemplary embodiment of the present invention, a method for manufacturing a display device includes forming a red pixel, a green pixel, and a blue pixel on a first surface of a transparent thin film encapsulation layer and forming a black matrix between adjacent pixels, from among the red, green, and the blue pixels. A transparent electrode is formed on a second surface of the thin film encapsulation layer, wherein the first and second surfaces of the transparent thin film encapsulation layer are opposite to each other. A photo-resist layer is formed on the transparent electrode layer. The photo-resist layer is exposed with ultraviolet rays through the first surface of the transparent thin film encapsulation layer. The photo-resist layer is developed. The transparent electrode layer is etched using the photo-resist layer as a mask. The photo-resist layer is removed.

In an exemplary embodiment of the present invention, a portion of the photo-resist layer that corresponds to the black matrix remains on the transparent thin film encapsulation layer after developing the photo-resist layer.

In an exemplary embodiment of the present invention, the black matrix is formed by depositing material on the first surface of the transparent thin film encapsulation layer, wherein the material that is deposited on the first surface of the transparent thin film encapsulation layer to form the black matrix passes through a pattern mask.

In an exemplary embodiment of the present invention, the black matrix includes a plurality of black matrix patterns, wherein a first black matrix pattern of the plurality of black matrix patterns has a width that is different from a width of a second black matrix pattern of the plurality of black matrix patterns.

In an exemplary embodiment of the present invention, the transparent electrode layer includes indium zinc oxide (IZO) or indium tin oxide (ITO).

In an exemplary embodiment of the present invention, the etching includes wet-etching.

In an exemplary embodiment of the present invention, the etching over-etches the transparent electrode layer such that the width of the transparent conductive layer is smaller than the width of the photo-resist layer in a portion corresponding to the black matrix.

In an exemplary embodiment of the present invention, the exposure is performed by irradiating ultraviolet rays using an ultraviolet ray lamp.

In an exemplary embodiment of the present invention, a method for manufacturing a display device includes forming first and second light blocking patterns on a transparent substrate. An insulating layer is formed on the first and second light blocking patterns. A conductive layer is formed on the insulating layer. A photo-resist layer is formed on the conductive layer. A region of the photo-resist layer that does not overlap the first and second light blocking patterns is exposed with ultraviolet rays by using the first and second light blocking patterns as a mask, wherein the ultraviolet rays enter the transparent substrate from a surface of the transparent substrate that is opposite to a surface of the transparent substrate on which the first and second light blocking patterns are formed. The photo-resist layer is developed. The conductive layer is wet-etched using the exposed photo-resist layer as a mask. The photo-resist layer is removed.

In an exemplary embodiment of the present invention, the first light blocking pattern has a width greater than that of the second light blocking pattern.

In an exemplary embodiment of the present invention, after the wet etching, a portion of the conductive layer that overlaps the first light blocking pattern remains on the transparent substrate and a portion of the conductive layer that overlaps the second light blocking pattern is completely etched.

BRIEF DESCRIPTION OF THE DRAWINGS

The above and other features and aspects of the present invention will become more apparent by describing in detail exemplary embodiments of the present invention with reference to the accompanying drawings, in which.

DETAILED DESCRIPTION OF THE EMBODIMENTS

Figure 1:
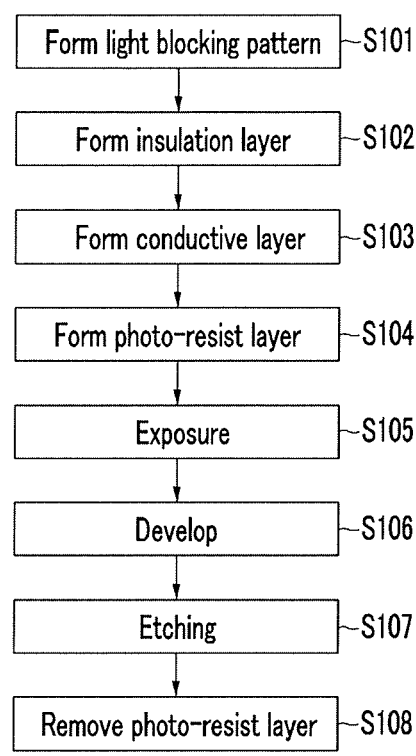
FIG. 1 is a flowchart of a display device manufacturing method according to an exemplary embodiment of the present invention.

Exemplary embodiments of the present invention will be described more fully hereinafter with reference to the accompanying drawings. The disclosed exemplary embodiments of the present invention may be modified in various different ways without departing from the spirit and scope of the present invention.

Like reference numerals may designate like elements throughout the specification. Accordingly, a repetitive description of elements already described may be omitted for brevity.

In the drawings, the relative proportions and ratios of elements may be exaggerated or diminished in size for clarity and convenience of illustration. When a part or element is said to be "over" or "on" another part or element, the part or element may be disposed directly over or on the other part or element, or intervening parts or elements may be disposed therebetween.

Hereinafter, a display device manufacturing method according to an exemplary embodiment of the present invention will be described with reference to FIG. 1 to FIG. 8.

FIG. 1 is a flowchart of a display device manufacturing method according to an exemplary embodiment of the present invention. FIG. 2 to FIG. 8 are cross-sectional views illustrating a display device manufacturing method according to an exemplary embodiment of the present invention.

Figure 2:
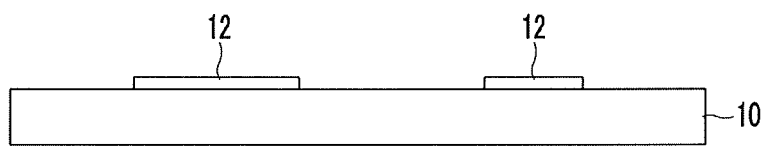
FIG. 2 to FIG. 8 are cross-sectional views illustrating a display device manufacturing method according to an exemplary embodiment of the present invention.

Referring to FIG. 2, light blocking patterns 12 respectively having different line widths are formed on the entire surface of a transparent substrate 10. This corresponds to step S101 of FIG. 1. The light blocking patterns 12 may be formed as opaque patterns, and may be made of metal. The light blocking patterns 12 may be formed through a plasma enhanced chemical vapor deposition (PECVD) process using a pattern mask. For example, the material that is included in the light blocking patterns 12 may pass through the mask to be deposited on the transparent substrate 10 to form the light blocking patterns 12.

Figure 3:
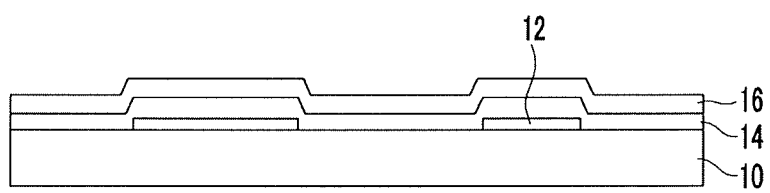

Referring to FIG. 3, an insulating layer 14 is formed on the transparent substrate 10 and the light blocking patterns 12. This corresponds to step S102 of FIG. 1. The insulating layer 14 may be formed on the entire surface of the transparent substrate 10 to cover the light blocking patterns 12. The insulating layer 14 may be deposited on the transparent substrate 10 through the PECVD process, and may include a silicon nitride.

A conductive layer 16 is formed on the insulating layer 14. This corresponds to step S103 of FIG. 1. The conductive layer 16 may be formed as a metal or transparent electrode. For example, the conductive layer 16 may include a metal or a transparent electrode. The conductive layer 16 may include a transparent conductive material, such as indium tin oxide (ITO) or indium zinc oxide (IZO), and may be deposited on the insulating layer 14.

Figure 4:
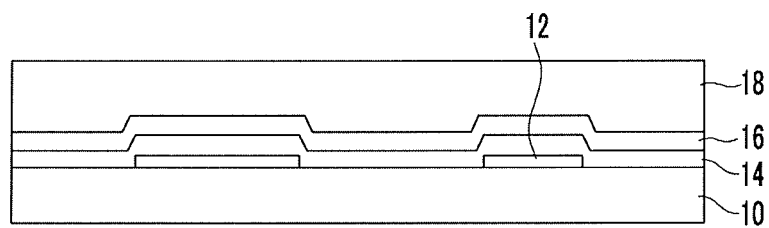

Referring to FIG. 4, a photo-resist layer 18 is formed on the conductive layer 16. This corresponds to step S104 of FIG. 1. In an exemplary embodiment of the present invention, the photo-resist layer 18 is a positive photo-resist layer 18 having an exposed portion that is developed and then removed. The photo-resist layer 18 may be formed by coating a photo-resist composition on the conductive layer 16 and prebaking the photo-resist composition for 1 to 15 minutes at a temperature of 70° C. to 110° C.

Figure 5:
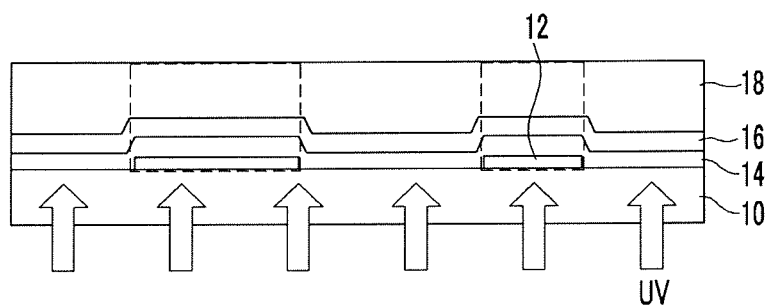

Referring to FIG. 5, the photo-resist layer 18 is exposed by having a rear surface of the transparent substrate 10 irradiated by ultraviolet rays. This corresponds to step S105 of FIG. 1. The rear surface of the transparent substrate 10 is a surface of transparent substrate 10 that is opposite to the surface of the transparent substrate 10 on which the light blocking patterns 12 are disposed. The ultraviolet rays are emitted by an ultraviolet lamp and enter the transparent substrate 10 through the rear surface of the transparent substrate 10. The light blocking patterns 12 act as a mask, blocking transmittance of the ultraviolet rays to a region of the photo-resist layer 18 that overlaps the light blocking patterns 12. Accordingly, the region of the photo-resist layer 18 that overlaps the light blocking patterns 12 is not exposed to the ultraviolet rays and the region of the photo-resist layer 18 that does not overlap the light blocking patterns 12 is exposed to the ultraviolet rays.

Figure 6:
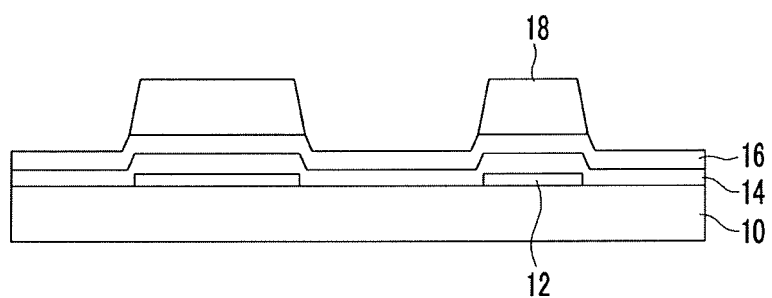

Referring to FIG. 6, the photo-resist layer 18 is developed. This corresponds to step S106 of FIG. 1. The region of the photo-resist layer 18 that is exposed to the ultraviolet rays may be removed by a developer, and the region of the photo-resist layer 18 that is not exposed to the ultraviolet rays remains in place. Accordingly, since a portion of the photo-resist layer 18 which overlaps the light blocking patterns 12 is not exposed to the ultraviolet rays, the portion of the photo-resist layer 18 which overlaps the light blocking pattern 12 remains in place after developing the photo-resist layer 18. The portion of the photo-resist layer 18 that is exposed to the ultraviolet rays is removed after developing the photo-resist layer 18.

Figure 7:
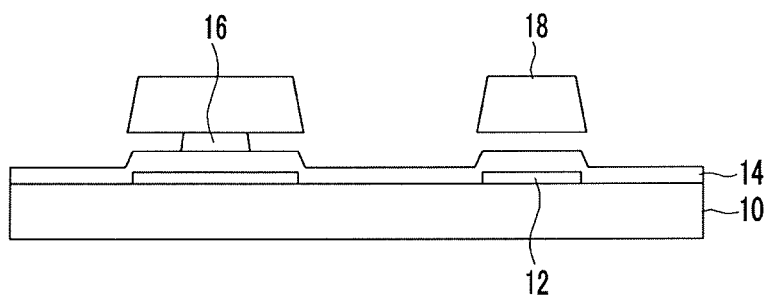

Referring to FIG. 7, the conductive layer 16 is etched using the portion of the photo-resist layer 18 that remains in place after developing the photo-resist layer 18 as a mask. This corresponds to step S107 of FIG. 1. In this case, the conductive layer 16 may be wet-etched by an etchant solution. Since the wet-etching has an anisotropic etching characteristic, the conductive layer 16 disposed below the photo-resist layer 18 may be over-etched, for example, under-cut. Accordingly, the conductive layer 16 disposed below the photo-resist layer 18 is etched to be more concave at an inner side of a light blocking pattern 12 than at an edge of the same light blocking pattern 12. For example, the wet-etching etches the conductive layer 16. A conductive layer pattern 16 results from etching the conductive layer 16. Due to the wet-etching, a width of a conductive layer pattern 16 that overlaps a corresponding photo-resist pattern 18 is smaller than a width of the corresponding photo-resist pattern 18. In this case, the degree of etching can be adjusted by controlling the temperature of the etchant or the etching time.

Since the plurality of light blocking patterns 12 respectively have different line widths, the portions of the photo-resist layer 18 and the portions of the conductive layer 16 corresponding to the light blocking patterns 12 or photo-resist layer patterns 18 of the photo-resist layer 18 may have irregular or different widths. A portion of the conductive layer 16 having a wide width may remain in place after the wet-etching (e.g., with a smaller width) and a portion of the conductive layer 16 having a narrow width may be removed by the wet-etching. Accordingly, the wet-etching process reduces the width of the portions of the conductive layer 16, for example, the conductive layer patterns 16, corresponding to the photo-resist layer patterns 18 of the photo-resist layer 18. In addition, the wet-etching process completely etches the conductive layer patterns 16 corresponding to the photo-resist layer patterns 18 of the photo-resist layer 18 depending on the width of the respective photo-resist layer patterns 18 of the photo-resist layer 18. For example, the wet-etching completely etches conductive layer patterns 16 having a width equal to or less than a threshold amount and reduces the width of conductive layer patterns 16 having a width greater than the threshold amount.

Figure 8:
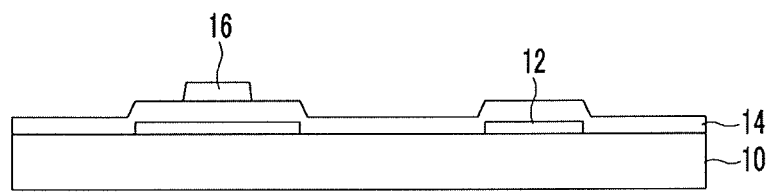

Referring to FIG. 8, the photo-resist layer 18 is removed to expose patterns of the conductive layer 16 having different widths. This corresponds to step S108 of FIG. 1. The patterns of the conductive layer 16 exposed by removal of the portions of the photo-resist layer 18 are the same as the etched portions of the conductive layer 16 that correspond to the light blocking patterns 12.

Figure 9:
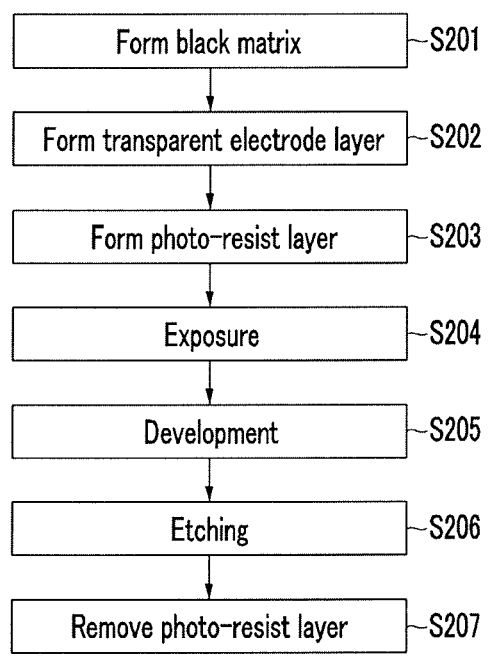
FIG. 9 is a flowchart of a display device manufacturing method according to an exemplary embodiment of the present invention.

FIG. 9 is a flowchart of a display device manufacturing method according to an exemplary embodiment of the present invention. FIG. 10 to FIG. 13 are cross-sectional views illustrating a display device manufacturing method according to an exemplary embodiment of the present invention. FIG. 14 is a top plan view that illustrates a metal mesh structure manufactured by a display device manufacturing method according to an exemplary embodiment of the present invention.

Referring to FIG. 9 to FIG. 14, red R, green G, and blue pixels B are formed on a transparent thin film encapsulation layer 20. A black matrix 22 is formed between adjacent pixels, from among the red R, green G, and blue pixels B. This corresponds to step S201 of FIG. 9. The red R, green G and blue pixels B and the black matrix 22 may be formed through a PECVD process using a pattern mask. For example, the material that is included in the black matrix 22 may pass through the mask to be deposited on the thin film encapsulation layer 20 to form the black matrix 22. The black matrix 22 may include a plurality of black matrix patterns 22, and the plurality of black matrix patterns 22 may have different widths.

Figure 10:
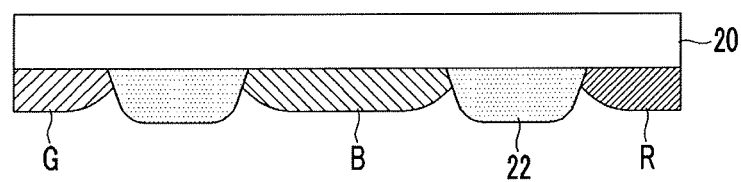
FIG. 10 to FIG. 13 are cross-sectional views illustrating a display device manufacturing method according to an exemplary embodiment of the present invention.

Referring to FIG. 10, a transparent electrode layer 26 is formed on the transparent thin film encapsulation layer 20. This corresponds to step S202 of FIG. 9. The transparent electrode 26 is formed on a surface of the film encapsulation layer 20 that is opposite to a surface of the encapsulation film 20 on which the red R, green G and blue pixels B and the black matrix 22 are disposed. The transparent electrode layer 26 may be made of a transparent conductive material such as ITO or IZO. The transparent electrode layer 26 may be formed on the entire surface of the thin film encapsulation layer 20.

Figure 11:
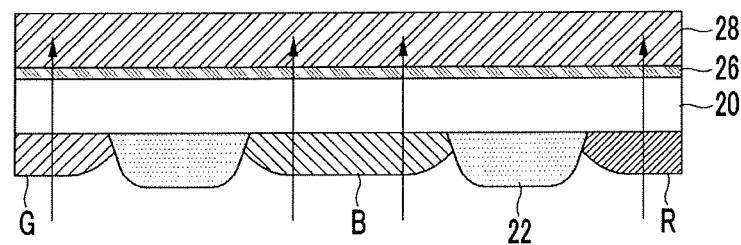

Referring to FIG. 11, a photo-resist layer 28 is formed on the transparent electrode layer 26. This corresponds to step S203 of FIG. 9. In an exemplary embodiment of the present invention, the photo-resist layer 28 is a positive photo-resist layer 28 having an exposed portion that is developed and then removed. The photo-resist layer 28 may be formed by coating a photo-resist component on the transparent electrode layer 26 and prebaking the photo-resist component for 1 to 15 minutes at a temperature of 70° C. to 110° C.

Referring to FIG. 11, the photo-resist layer 28 is exposed by having the surface of the transparent thin film encapsulation layer 20 on which the red R, green G and blue pixels B and the black matrix 22 are disposed irradiated with ultraviolet rays. This corresponds to step S204 of FIG. 9. The ultraviolet rays are emitted by an ultraviolet lamp and enter the transparent thin film encapsulation layer 20 through the surface of the transparent thin film encapsulation layer 20 on which the red R, green G and blue pixels B and the black matrix 22 are disposed. The black matrix 22 acts as a mask, blocking transmittance of the ultraviolet rays to a region of the photo-resist layer 28 that overlaps the black matrix 22. Accordingly, the region of the photo-resist layer 28 that overlaps the black matrix 22 is not exposed to the ultraviolet rays and the region of the photo-resist layer 28 that does not overlap the black matrix 22 is exposed to the ultraviolet rays.

Figure 12:
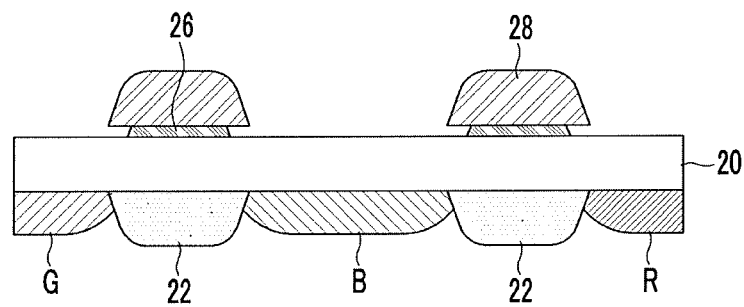

Referring to FIG. 12, the photo-resist layer 28 is developed. This corresponds to step S205 of FIG. 9. The region of the photo-resist layer 28 that is exposed by ultraviolet rays may be removed by a developer, and the region of the photo-resist layer 28 that is not exposed to the ultraviolet rays remains in place. Accordingly, since a portion of the photo-resist layer 28 which overlaps the black matrix 22 is not exposed to the ultraviolet rays, the portion of the photo-resist layer 28 which overlaps the black matrix 22 remains in place after developing the photo-resist layer 28. The portion of the photo-resist layer 28 that is exposed to the ultraviolet rays is removed after developing the photo-resist layer 28.

Referring to FIG. 12, the transparent electrode layer 26 is etched using the portion of the photo-resist layer 28 that remains in place after developing the photo-resist layer 28 as a mask. This corresponds to step S206 of FIG. 9. In this case, the transparent electrode layer 26 may be wet-etched by an etchant solution. The transparent electrode layer 26 disposed below the photo-resist layer 28 may be over-etched. Accordingly, that the transparent electrode layer 26 may be more concave at an inner side of a black matrix 22 pattern than at an edge of the same black matrix 22 pattern.

Figure 13:
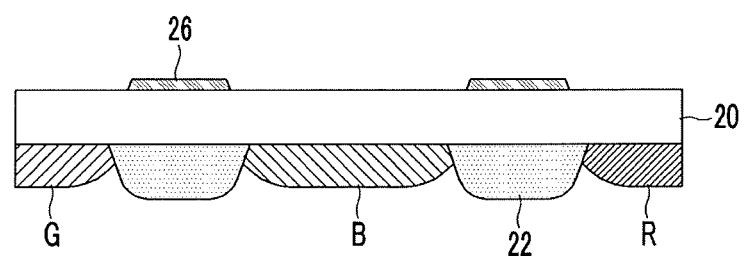
Figure 14:
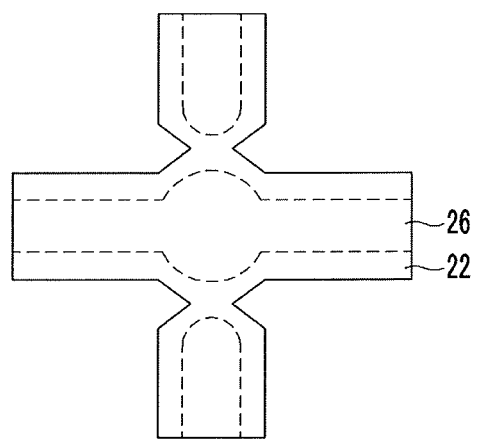
FIG. 14 is a plan view that illustrates a metal mesh structure manufactured by a display device manufacturing method according to an exemplary embodiment of the present invention.

Referring to FIG. 13, the photo-resist layer 28 is removed to expose a plurality of transparent electrode patterns 26. This corresponds to step S207 of FIG. 9.

Patterns of the black matrixes 22 may be formed to be different from each other such that the widths of the transparent electrode patterns 26 may be formed to be different from each other. As shown in FIG. 14, a metal mesh structure may be formed so that a part of the transparent electrode layer 26 does not remain on the transparent thin film encapsulation layer 20.

Figure 15:
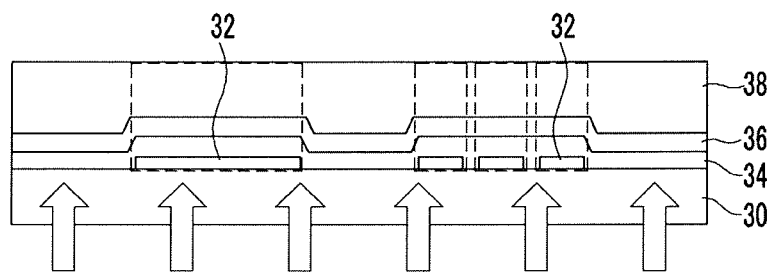
FIG. 15 and FIG. 16 are cross-sectional views illustrating a display device manufacturing method according to an exemplary embodiment of the present invention.
Figure 16:
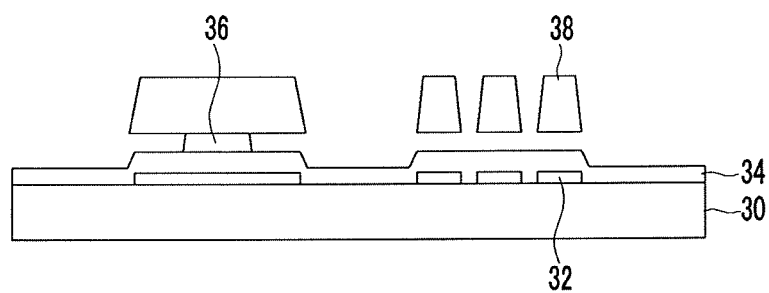

FIG. 15 and FIG. 16 are cross-sectional views illustrating a display device manufacturing method according to an exemplary embodiment of the present invention.

Referring to FIG. 15, a light blocking pattern 32 having a wide width and a light blocking pattern 32 formed of a slit pattern having a narrow width are formed on a front surface of a transparent substrate 30. A rear surface of the transparent substrate 30 is opposite to the front surface of the transparent substrate 30. A photo-resist layer 38 is exposed by ultraviolet rays from the rear surface of the transparent substrate 30.

Referring to FIG. 16, the photo-resist layer 38 is developed. Then, a conductive layer 36 disposed between an insulating layer 34 and the photo-resist layer 38 is wet-etched using the portion of the photo-resist layer 38 that remains after developing the photo-resist layer 38 as a mask. The portion of the photo-resist layer 38 that remains after developing the photo-resist layer 38 is removed so the portion of the conductive layer 36 corresponding to the light blocking pattern 32 having the wide width remains on the insulating layer 34. The wet-etching completely etches the portion of the conductive layer 36 corresponding to the light blocking pattern 32 having the narrow width. The portion of the conductive layer 36 corresponding to the light blocking pattern 32 having the narrow width is completely etched due to the width of the individual light blocking patterns 32 that make up the light blocking pattern 32 having the narrow width.

As described, in a display device manufacturing method according to an exemplary embodiment of the present invention, when a metal or transparent electrode pattern is formed, a lower opaque light blocking pattern or a black matrix is formed to have predetermined and/or varying line width. Then, a bottom surface exposure method is used to adjust the line width of the metal or transparent electrode pattern at a specific location and selectively short-circuit a first metal or transparent electrode pattern with a second metal or transparent electrode pattern at the specific location. Accordingly, a degree of freedom in the forming of patterns in increased.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A method for manufacturing a display device, comprising:
   forming a red pixel, a green pixel, and a blue pixel on a first surface of a transparent thin film encapsulation layer and forming a black matrix between adjacent pixels, from among the red, green, and the blue pixels;
   forming a transparent electrode layer on a second surface of the thin film encapsulation layer, wherein the first and second surfaces of the transparent thin film encapsulation layer are opposite to each other;
   forming a photo-resist layer on the transparent electrode layer;
   exposing the photo-resist layer with ultraviolet rays through the first surface of the transparent thin film encapsulation layer;
   developing the photo-resist layer;
   etching the transparent electrode layer using the photo-resist layer as a mask; and
   removing the photo-resist layer,
   wherein the etching over-etches the transparent electrode layer such that the width of the transparent electrode layer is smaller than the width of the photo-resist layer in a portion of the photo-resist layer overlapping with a corresponding portion of the black matrix.

2. The display device manufacturing method of claim 1, wherein a portion of the photo-resist layer that corresponds to the black matrix remains on the transparent thin film encapsulation layer after developing the photo-resist layer.

3. The display device manufacturing method of claim 1, wherein the black matrix is formed by depositing material on the first surface of the transparent thin film encapsulation layer, wherein the material that is deposited on the first surface of the transparent thin film encapsulation layer to form the black matrix passes through a pattern mask.

4. The display device manufacturing method of claim 1, wherein the black matrix includes a plurality of black matrix patterns, wherein a first black matrix pattern of the plurality of black matrix patterns has a width that is different from a width of a second black matrix pattern of the plurality of black matrix patterns.

5. The display device manufacturing method of claim 1, wherein the transparent electrode layer includes indium zinc oxide (IZO) or indium tin oxide (ITO).

6. The display device manufacturing method of claim 1, wherein the etching includes wet-etching.

7. The display device manufacturing method of claim 1, wherein the exposure is performed by irradiating ultraviolet rays using an ultraviolet ray lamp.

* * * * *